United States Patent [19]
Mathews et al.

[11] Patent Number: 5,726,092
[45] Date of Patent: Mar. 10, 1998

[54] SEMICONDUCTOR PROCESSING METHODS OF FORMING FIELD OXIDATION REGIONS ON A SEMICONDUCTOR SUBSTRATE

[75] Inventors: Viju Mathews; Pierre C. Fazan; Nanseng Jeng, all of Boise, Id.

[73] Assignee: Micron Technology, Inc., Boise, Id.

[21] Appl. No.: 855,764

[22] Filed: May 23, 1997

Related U.S. Application Data

[63] Continuation of Ser. No. 427,084, Apr. 20, 1995, abandoned.
[51] Int. Cl.$^6$ ................................................. H01L 21/76
[52] U.S. Cl. ........................................ 438/439; 438/443
[58] Field of Search ................................ 437/40 R, 60, 437/61, 62, 69, 70, 72, 239; 438/439, 443

[56] References Cited

U.S. PATENT DOCUMENTS

| | | | |
|---|---|---|---|
| 4,554,726 | 11/1985 | Hillenius et al. | 437/69 |
| 4,987,093 | 1/1991 | Teng et al. | 437/69 |
| 5,061,654 | 10/1991 | Shimizu et al. | 437/60 |
| 5,134,089 | 7/1992 | Barden et al. | 437/70 |
| 5,234,859 | 8/1993 | Mametani et al. | 437/69 |
| 5,358,894 | 10/1994 | Fazan et al. | 437/70 |
| 5,374,586 | 12/1994 | Huang et al. | 437/69 |
| 5,393,694 | 2/1995 | Mathews | 437/72 |
| 5,472,904 | 12/1995 | Figura et al. | 437/69 |
| 5,543,343 | 8/1996 | Bryant et al. | 437/69 |

OTHER PUBLICATIONS

Bryant, Andres, et al., "Characteristics of CMOS Device Isolation for the VLSI Age", *IEDM Technical Digest*, IEEE, pp. 671–674 (1994).

Chatterjee et al, "A Shallow Trench Isolation Study for 0.25/0.18 micron CMOS Technologies and Beyond"; 1996 Symposium on VLSI Tech. Dig. of Technical papers, p. 156.

*Primary Examiner*—Michael Trinh
*Attorney, Agent, or Firm*—Wells, St. John, Roberts, Gregory & Matkin, P.S.

[57] ABSTRACT

A semiconductor processing method of forming a pair of adjacent field oxide regions includes, i) providing a sacrificial pad oxide layer to a thickness of from 20 Angstroms to 100 Angstroms; ii) providing a patterned masking layer over the sacrificial pad oxide layer and over a desired active area region, the layer having a thickness of from 500 Angstroms to 3000 Angstroms and comprising a pair of adjacent masking blocks having a minimum pitch of from 0.5 micron to 0.7 micron; iii) oxidizing portions of the substrate unmasked by the masking layer in an $O_2$ ambient at a pressure of at least 15 atmospheres to form at least one pair of adjacent field oxide regions, the ambient being substantially void of $H_2O$ during the oxidizing, the formed field oxide regions having a location of maximum thickness of from 1500 Angstroms to 3000 Angstroms; iv) stripping the masking layer from the substrate; v) providing a gate oxide layer over the active area between the pair of field oxide regions; and vi) etching portions of the field oxide regions prior to providing the gate oxide, such etching resulting in removal of a total of from 250 to 1000 Angstroms of oxide from the field oxide regions prior to provision of the gate oxide, such etching resulting in a maximum width of the respective field oxide regions of from 0.20 to 0.40 micron and a minimum pitch of the adjacent pair of field oxide regions of from 0.5 to 0.7 micron.

11 Claims, 4 Drawing Sheets

SEMICONDUCTOR PROCESSING METHODS OF FORMING FIELD OXIDATION REGIONS ON A SEMICONDUCTOR SUBSTRATE

This application is a continuation of application Ser. No. 08/427,084 filed Apr. 20, 1995, now abandoned.

TECHNICAL FIELD

This invention relates to semiconductor processing methods of forming field oxide regions on semiconductor substrates.

BACKGROUND PRIOR ART TO THE INVENTION

The reduction in memory cell and other circuit size required for high density dynamic random access memories (DRAMs) and other circuitry is a continuing goal in semiconductor fabrication. Implementing electric circuits involves connecting isolated devices through specific electric paths. When fabricating silicon and other material into integrated circuits, it is necessary to isolate devices built into the substrate from one another. Electrical isolation of devices as circuit density increases is a continuing challenge.

One method of isolating devices involves the formation of a semi-recessed or fully recessed oxide in the nonactive (or field) area of the substrate. These regions are typically termed as "field oxide" and are formed by LOCal Oxidation of exposed Silicon, commonly known as LOCOS. One approach in forming such oxide is to cover the active regions with a thin layer of silicon nitride that prevents oxidation from occurring therebeneath. A thin intervening layer of a sacrificial pad oxide is provided intermediate the silicon substrate and nitride layer to alleviate stress and protect the substrate from damage during subsequent removal of the nitride layer. The unmasked or exposed field regions of the substrate are then subjected to a wet $H_2O$ oxidation, typically at atmospheric pressure and at temperatures of around 1000° C., for two to four hours. This results in field oxide growth where there is no masking nitride.

However at the edges of the nitride, some oxidant also diffuses laterally. This causes the oxide to grow under and lift the nitride edges. Because the shape of the oxide at the nitride edges is that of a slowly tapering oxide wedge that merges into another previously formed layer of oxide, it has commonly been referred to as a "bird's beak". The bird's beak is a lateral extension or encroachment of the field oxide into the active areas where the devices are formed. Although the length of the bird's beak depends upon a number of parameters, the length is typically 0.15 micron–0.5 micron per side.

This thinner area of oxide resulting from the bird's beak provides the disadvantage of not providing effective isolation in these regions, and as well unnecessarily consumes precious real estate on the semiconductor wafer. Further, as the circuit density (commonly referred to as minimum device pitch) falls below 1.0 micron, conventional LOCOS techniques fail due to excessive encroachment of the oxide beneath the masking stack. The closeness of the masking block stacks in such instances results in effective joining of adjacent bird's beaks, thus effectively lifting the stacks and resulting in no masking effect to the oxidation.

Another undesired phenomenon occurs during growth of the field oxide, which is commonly referred to as the Kooi effect. Specifically, a thin layer of silicon nitride forms on the silicon surface at the pad oxide/silicon interface as a result of a reaction of $NH_3$, $H_2O$ and silicon at that interface during field oxidation. This $NH_3$ diffuses through the pad oxide and reacts with the silicon substrate to form silicon nitride spots or ribbons which significantly adversely impact subsequent gate oxidation growth. The typical way of removing or attending to these silicon-nitride spots is by growth of a subsequent sacrificially oxide layer. This layer is later removed, typically by a wet oxide strip.

It would be desirable to develop alternate techniques which enable use of a dry, high pressure, $O_2$ oxidizing ambient for oxidizing conditions to minimize bird's beak encroachment. The inventors are aware of no such techniques for specific use in 0.5 micron to 0.7 micron pitch technology. It would also be desirable to develop techniques which effectively eliminate the Kooi effect, such that active area re-oxidation is unnecessary.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
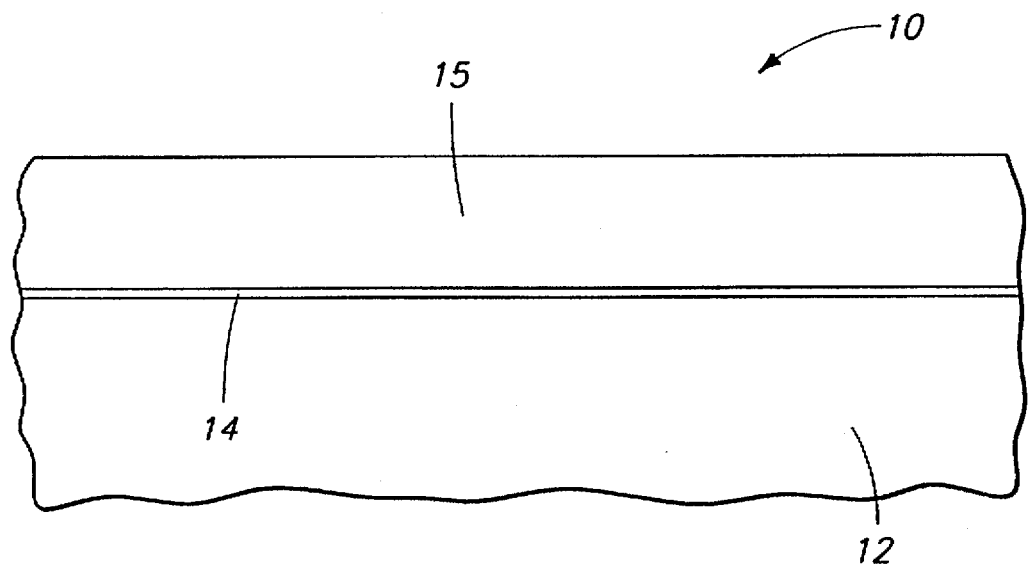
FIG. 1 is a diagrammatic sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a pair of adjacent field oxide regions having a minimum pitch of from 0.5 micron to 0.7 micron on a semiconductor substrate comprises the following steps:

providing a sacrificial pad oxide layer over a semiconductor substrate to a thickness of from 20 Angstroms to 100 Angstroms;

providing a patterned masking layer over the sacrificial pad oxide layer and over a desired active area region of the substrate, the masking layer comprising a nitride and having a thickness of from 500 Angstroms to 3000 Angstroms, the patterned masking layer comprising a pair of adjacent masking blocks having a minimum pitch of from 0.5 micron to 0.7 micron;

oxidizing portions of the substrate unmasked by the masking layer in an $O_2$ ambient at a pressure of at least 15 atmospheres to form at least one pair of adjacent field oxide regions on the substrate, the ambient being substantially void of $H_2O$ during the oxidizing, the formed field oxide regions having a location of maximum thickness of from 1500 Angstroms to 3000 Angstroms, the pair of field oxide regions defining active area therebetween; stripping the patterned masking layer from the substrate; providing a gate oxide layer on the substrate over the active area between the pair of field oxide regions; and etching portions of the pair of field oxide regions prior to providing the gate oxide layer, such etching resulting in removal of a total of from 250 Angstroms to 1000 Angstroms of oxide from the field oxide regions prior to provision of the gate oxide layer, such etching resulting in a maximum width of the respective field oxide regions of from 0.20 micron to 0.40 micron and a minimum pitch of the adjacent pair of field oxide regions of from 0.5 micron to 0.7 micron.

In accordance with another aspect of the invention, a semiconductor processing method of forming a pair of adjacent field oxide regions on a semiconductor substrate comprises the following steps:

providing a sacrificial pad oxide layer over a semiconductor substrate;

providing a patterned masking layer over the sacrificial pad oxide layer and over a desired active area region of the substrate, the masking layer comprising a nitride;

oxidizing unmasked portions of the substrate in an $O_2$ ambient to form at least one pair of adjacent field oxide regions on the substrate, the ambient being substantially void of $H_2O$ during the oxidizing, such oxidizing restricting silicon nitride formation at the pad oxide/silicon interface thereby essentially eliminating the Kooi effect, the pair of field oxide regions defining active area therebetween;

stripping the patterned masking layer from the substrate; and providing a gate oxide layer on the substrate over the active area between the pair of field oxide regions, there being no intervening provision of any sacrificial oxide layer on the substrate within the active area between the oxidizing step and the gate oxide layer provision step.

More particularly with reference to the figures, FIG. 1 illustrates a semiconductor wafer fragment in process for formation of a pair of adjacent field oxide regions having a minimum pitch of from 0.5 micron to 0.7 micron, and is indicated generally with reference numeral 10. Such is comprised of a starting bulk semiconductor silicon substrate 12. A sacrificial pad oxide layer 14 is thermally grown over semiconductor substrate 12 to a thickness of from 20 Angstroms to 100 Angstroms. A masking layer 15, preferably $Si_3N_4$, is provided over sacrificial pad oxide layer 14 to a thickness of from 500 Angstroms to 3000 Angstroms. The function of layer 14 is to cushion the transition of stresses between silicon substrate 12 and nitride layer 15. Nitride layer 15 will function as the masking layer for ultimate formation of the field oxide regions in accordance with aspects of the invention.

Figure 2:
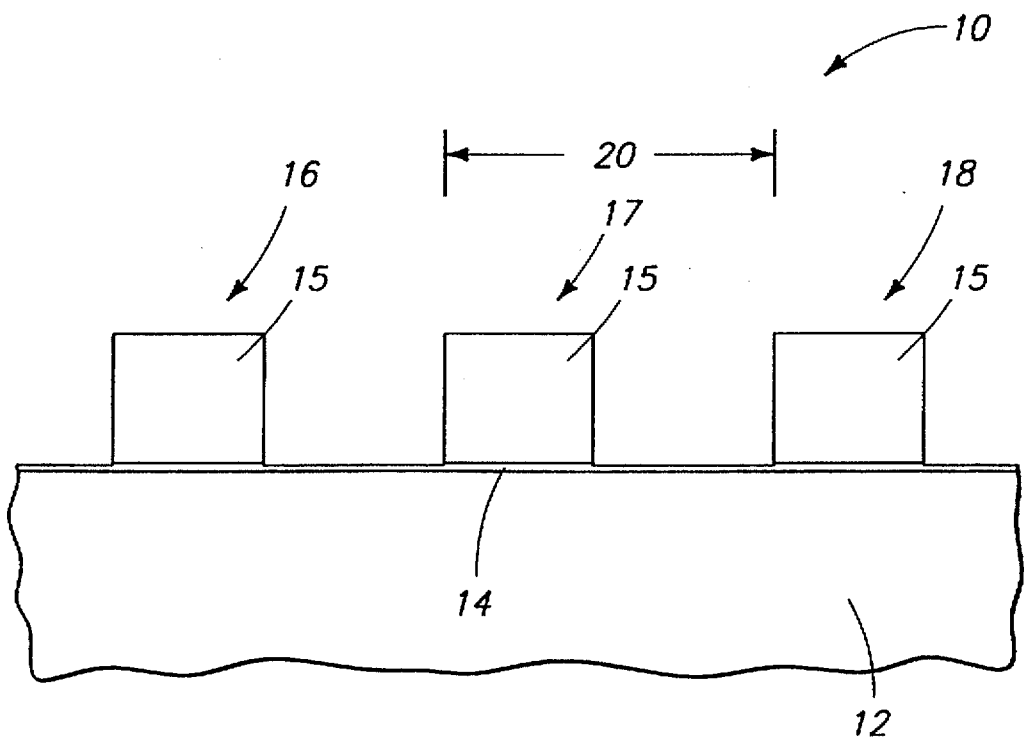
FIG. 2 is a view of the FIG. 1 wafer fragment at a processing step subsequent to that shown by FIG. 1.

Referring to FIG. 2, nitride layer 15 has been patterned and etched as shown to form nitride masking blocks 16, 17 and 18. A channel-stop implant can be conducted prior to removing the illustrated masking blocks, but is not particularly germane to this invention. The etch to produce nitride blocks 16, 17 and 18 is substantially selective to oxide layer 14. However, the etch does result in removal of a portion of pad oxide layer 14 in an uneven manner due to the inherent preferred thinness of layer 14. Blocks 16, 17 and 18 are provided to define and thereby overlie desired active area regions on the substrate. The illustrated masking blocks provide a minimum pitch 20 of adjacent blocks of from 0.5 micron to 0.7 micron, with 0.6 micron being typical and preferred.

Figure 3:
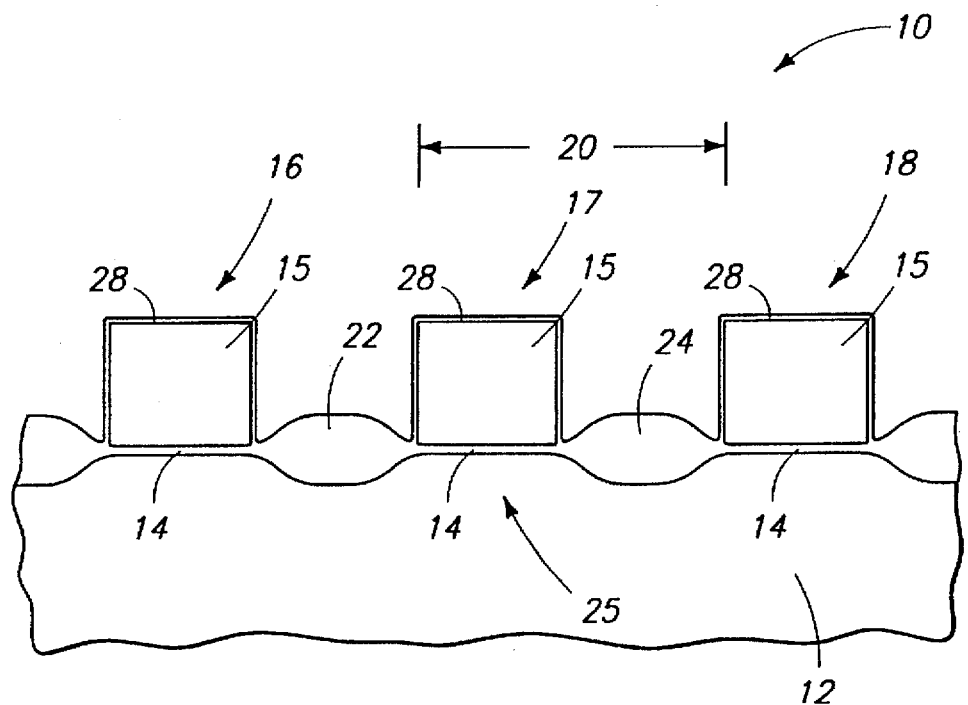
FIG. 3 is a view of the FIG. 1 wafer fragment at a processing step subsequent to that shown by FIG. 2.

Referring to FIG. 3, the wafer is subjected to oxidizing conditions to oxidize portions of the substrate which are unmasked by masking material 15 to form the illustrated pair of adjacent field oxide regions 22 and 24 relative to substrate 12. The oxidation is conducted in an $O_2$ ambient at a pressure of at least 15 atmospheres. The atmosphere is essentially void of $H_2O$ during the oxidizing, and constitutes essentially pure $O_2$ or $O_2$ injected into the reactor in combination with a carrier gas, such as $N_2$ or Ar. The preferred upper pressure limit for the oxidation is 50 atmospheres, with 25 atmospheres being a more preferred condition. The preferred temperature range during oxidation is from 950° C. to 1300° C. Growth rate in such a dry oxygen ambient at 25 atmospheres pressure at 1000° C. is 4000 Angstroms per 70 minutes. Regardless in accordance with this aspect of the invention, the oxidation is conducted to provide field oxide regions 22 and 24 to have a location of maximum thickness of from 1500 Angstroms to 3000 Angstroms. As depicted, field oxide regions 22 and 24 define substrate active area 25 therebetween. During field oxidation, a very thin layer 28 of oxide (20–200 Angstroms) results from transformation of the $Si_3N_4$ to $SiO_2$.

Figure 4:
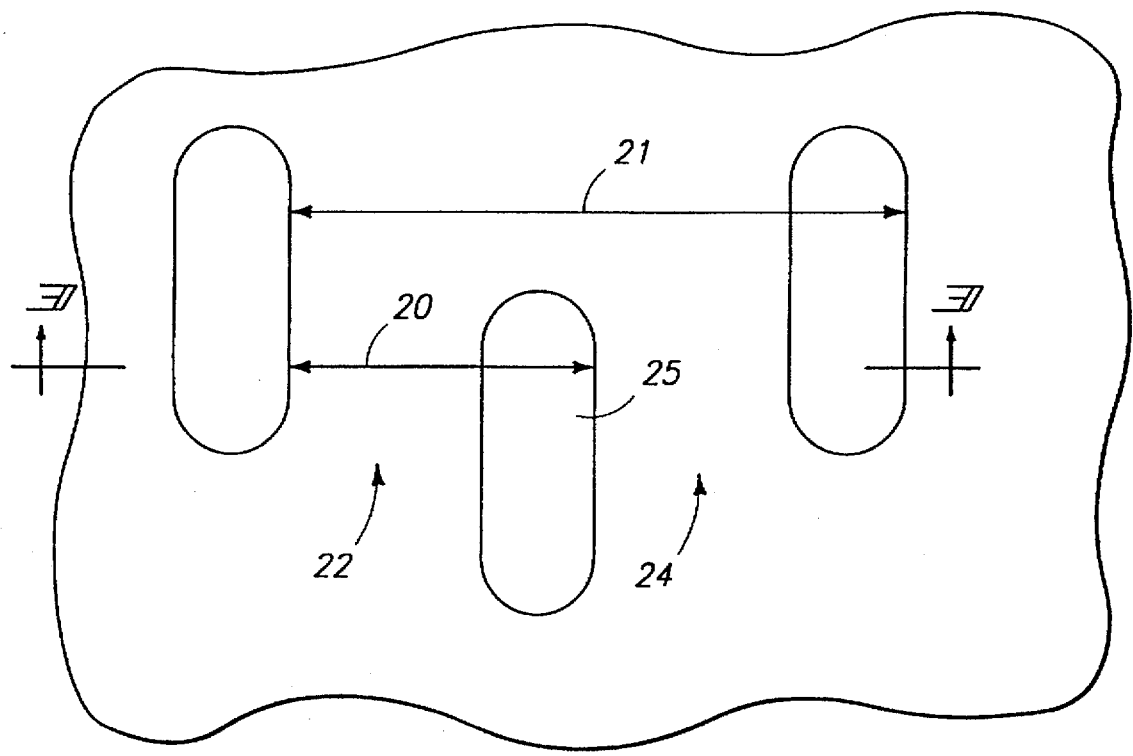
FIG. 4 is a diagrammatic top view of FIG. 3 showing the field oxide regions.

FIG. 4 illustrates a diagrammatic top view of FIG. 3 emphasizing the illustrated field oxide regions 22 and 24, and active area 25 therebetween. A staggered layout of the active area regions is preferably utilized, with pitch 20 being the minimum pitch between most closely adjacent field oxide regions. The staggering produces a wider pitch 21 (FIG. 4 only) between further spaced adjacent field oxide regions, as shown. During field oxidation, the location of maximum field oxide thickness typically occurs centrally relative to the respective widths of the regions along the wider pitch line 21. Field oxide thickness is typically less along pitch line 20, where substrate stress is greater due to closeness of the adjacent nitride masks.

Figure 5:
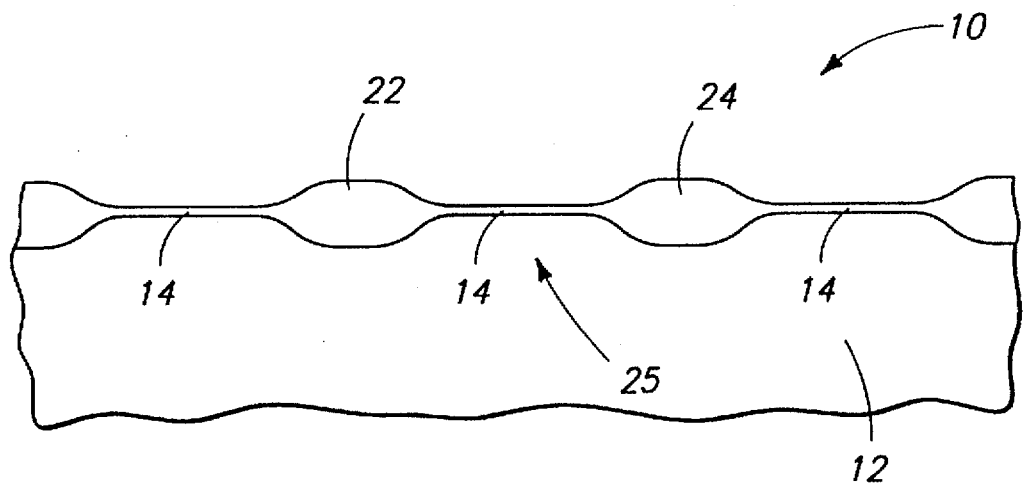
FIG. 5 is a view of the FIG. 1 wafer fragment at a processing step subsequent to that shown by FIG. 3.

Referring to FIG. 5, oxide layer 28 has been removed from the nitride layer 15 (not shown), resulting in removal of oxide from atop field oxide regions 24 in a quanta of from 50 Angstroms to 250 Angstroms. Patterned masking material 15 is then stripped from the substrate.

Figure 6:
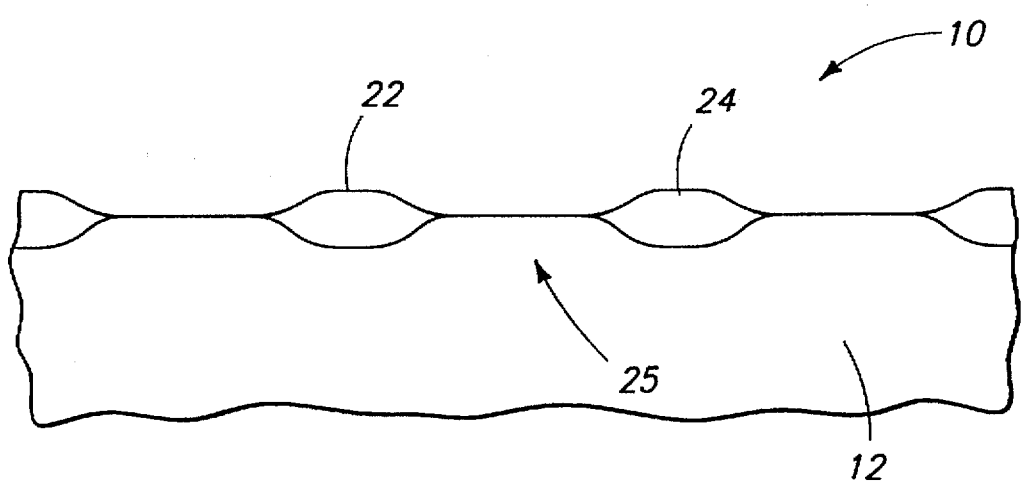
FIG. 6 is a view of the FIG. 1 wafer fragment at a processing step subsequent to that shown by FIG. 5.

Referring to FIG. 6, sacrificial pad oxide layer 14 is stripped from the substrate, with such stripping typically and preferably comprising etching from 50 Angstroms to 500 Angstroms of oxide from atop field oxide regions 22 and 24. Such pad oxide removal and etching of the field oxide regions also results in desired pull-back of the bird's beaks encroachment into the active area regions.

Figure 7:
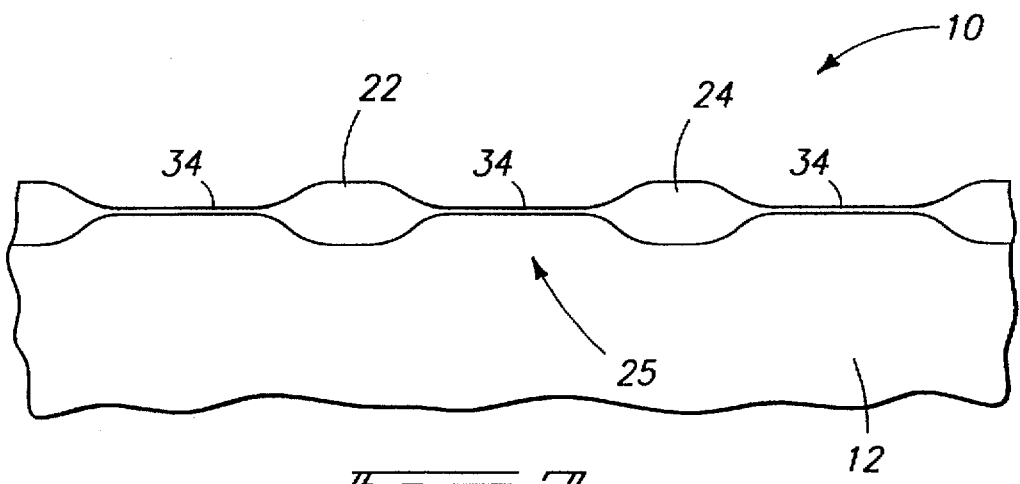
FIG. 7 is a view of the FIG. 1 wafer fragment at a processing step subsequent to that shown by FIG. 6.

Referring to FIG. 7, a sacrificial layer of oxide 34 is grown to a thickness of from 150 Angstroms to 350 Angstroms over the exposed silicon substrate, if desired, to overcome nitride problems associated with the Kooi effect. A considerably thinner layer of such sacrificial oxide grows in the field oxide regions 22 and 24 (i.e., 50–200 Angstroms).

Figure 8:
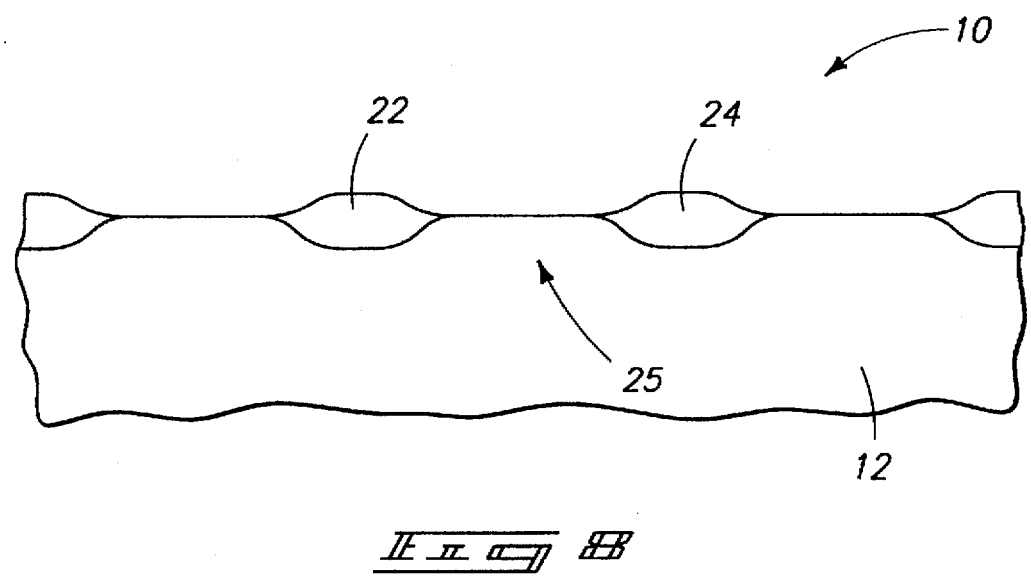
FIG. 8 is a view of the FIG. 1 wafer fragment at a processing step subsequent to that shown by FIG. 7.

Referring to FIG. 8, sacrificial oxide layer 34 is stripped from the substrate, typically resulting in oxide removal from field oxide regions 22 and 24 of from 200 Angstroms to 400 Angstroms. Such also provides an added effect of further reducing encroachment of the bird's beaks regions into the active areas.

In accordance with another aspect of the invention, the FIGS. 7 and 8 re-oxidation and stripping steps are advantageously eliminated due to utilization of dry oxidation conditions in an $O_2$ atmosphere essentially void of $H_2O$. In otherwords, such oxidizing conditions restrict silicon nitride formation at the pad oxide/silicon interface, thereby essentially eliminating the Kooi effect such that active area re-oxidation is expected to be unnecessary.

Figure 9:
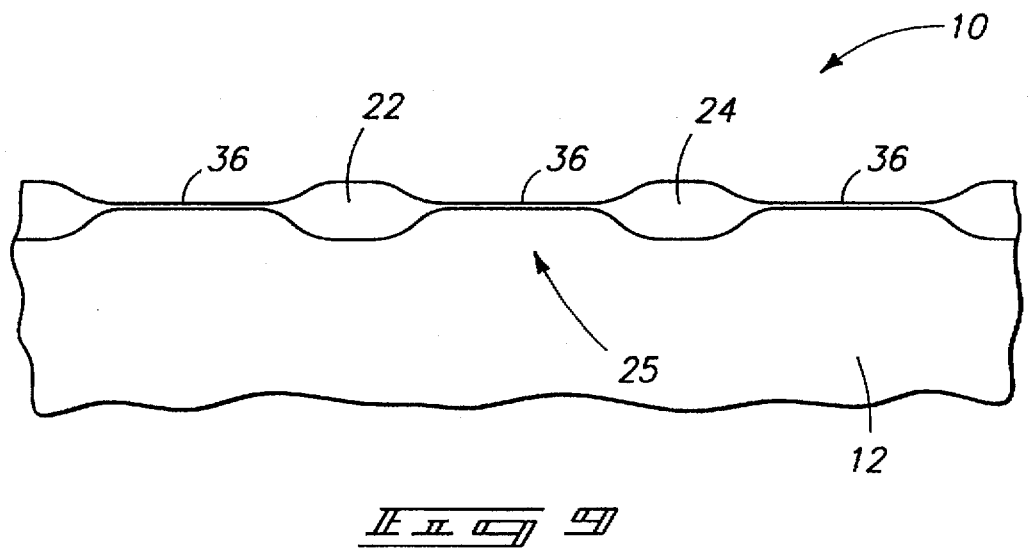
FIG. 9 is a view of the FIG. 1 wafer fragment at a processing step subsequent to that shown by FIG. 8.

Referring to FIG. 9, a gate oxide layer 36 is provided on the substrate over active area 25 between field oxide regions 22 and 24. In accordance with a significant feature of an aspect of the invention, the etching of the field oxide regions after their formation and immediately prior to provision of gate oxide layer 36 is conducted such that a total of from 250 Angstroms to 1000 Angstroms is removed from the field oxide regions. Such etching will result in a resultant width of the respective field oxide regions of from 0.20 micron to 0.40 micron in a key and resultant desired pitch of the adjacent pair of field oxide regions of from 0.5 micron to 0.7 micron.

The nitride thickness in comparison with the pad oxide thickness ranges from 1000 Angstroms to 3000 Angstroms for a pad oxide thickness of greater than 60 Angstroms up to 100 Angstroms. When the pad oxide thickness is 60 Angstroms or less, the masking nitride layer is provided to a thickness of from 500 Angstroms to 1000 Angstroms. An example preferred combination is a pad oxide layer thickness of 90 Angstroms and a nitride masking layer thickness of 2000 Angstroms.

The above described process for provision of field oxide regions using the described LOCOS technology in 0.5 micron–0.7 micron pitch fabrication only applies within the above described combinations of specific parameters of oxide thicknesses, nitride thickness and resultant field oxide widths. For example, pad oxide thickness below 20 Angstroms will not provide effective protection of the silicon substrate during nitride removal. A pad oxide thickness of greater than 100 Angstroms will adversely and significantly increase the bird's beaks encroachment to an unacceptable level. Further, thicker nitride layers outside of the above described specific ranges have been determined to adversely impact stress in the resultant substrate after field oxidation to an unacceptable level. Thinner nitride layers outside of the above ranges leads to excessive and unacceptable encroachment, thus defeating the oxidation masking. Further, the above defined thickness range of from 1500 Angstroms to 3000 Angstroms of the field oxide regions immediately after field oxidation has been determined to be critical in the context of the 0.5 micron to 0.7 micron pitch density. Thinner oxide results in very low field oxide thickness in the array such that adequate isolation does not occur. Thicker field oxide formation again results in undesired excessive encroachment into the active area. Total oxide loss of field oxide outside of the stated and claimed 250 to 1000 Angstrom range between field oxidation and immediately prior to provision of gate oxide likewise results in unacceptable resultant isolation. The resultant field oxide width of from 0.20 micron to 0.40 micron is necessary in the context of the above described 0.5 micron to 0.7 micron pitch density.

The above described description with respect to elimination of the Kooi effect is not however necessarily associated with the critical dimensional ranges provided above, and is accordingly believed applicable to other than 0.5 micron to 0.7 micron pitch technology.

The invention also comprises products produced by the above processes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming a pair of adjacent field oxide regions having a minimum pitch of from 0.5 micron to 0.7 micron on a semiconductor substrate, the method comprising the following steps:

forming a sacrificial pad oxide layer over a semiconductor substrate to a thickness of from 20 Angstroms to 100 Angstroms;

forming a patterned masking layer over the sacrificial pad oxide layer and over a desired active area region of the substrate, the masking layer comprising a nitride and having a thickness of from 500 Angstroms to 3000 Angstroms, the patterned masking layer comprising a pair of adjacent masking blocks having a minimum pitch of from 0.5 micron to 0.7 micron;

oxidizing portions of the substrate unmasked by the masking layer in an $O_2$ comprising ambient at a pressure of at least 15 atmospheres to form at least one pair of adjacent field oxide regions on the substrate, the ambient being substantially void of $H_2O$ during the oxidizing, the formed field oxide regions having a location of maximum thickness of from 1500 Angstroms to 3000 Angstroms, the pair of field oxide regions defining an active area therebetween;

removing the patterned masking layer from the substrate;

removing the sacrificial pad oxide layer from over the active area between the pair of field oxide regions;

forming a gate oxide layer on the substrate over the active area between the pair of field oxide regions; and etching portions of the pair of field oxide regions prior to providing the gate oxide layer, such etching resulting in removal of a total of from 250 Angstroms to 1000 Angstroms of oxide from the field oxide regions prior to provision of the gate oxide layer, such etching resulting in a maximum width of the respective field oxide regions of from 0.20 micron to 0.40 micron and a minimum pitch of the adjacent pair of field oxide regions of from 0.5 micron to 0.7 micron.

2. The semiconductor processing method of claim 1 wherein the step of removing the sacrificial pad oxide layer also comprises etching from 50 Angstroms to 500 Angstroms of the field oxide regions.

3. The semiconductor processing method of claim 1 wherein the sacrificial pad oxide layer is provided to a thickness of less than or equal to 60 Angstroms, and the masking layer is provided to a thickness of from 500 Angstroms to 1000 Angstroms.

4. The semiconductor processing method of claim 1 wherein the sacrificial pad oxide layer is provided to a thickness of 90 Angstroms, and the masking layer is provided to a thickness of 2000 Angstroms.

5. The semiconductor processing method of claim 1 wherein the step of removing the sacrificial pad oxide layer also comprises etching from 50 Angstroms to 500 Angstroms of the field oxide regions; and wherein the sacrificial pad oxide layer is provided to a thickness of less than or equal to 60 Angstroms, and the masking layer is provided to a thickness of from 500 Angstroms to 1000 Angstroms.

6. The semiconductor processing method of claim 1 wherein the step of removing the sacrificial pad oxide layer also comprises etching from 50 Angstroms to 500 Angstroms of the field oxide regions; and wherein the sacrificial pad oxide layer is provided to a thickness of 90 Angstroms, and the masking layer is provided to a thickness of 2000 Angstroms.

7. The semiconductor processing method of claim 1 wherein the pressure during the oxidizing step is less than or equal to 50 atmospheres.

8. The semiconductor processing method of claim 1 wherein the pressure during the oxidizing step is less than or equal to 25 atmospheres.

9. The semiconductor processing method of claim 1 wherein the temperature during the oxidizing step is from 950° C. to 1300° C.

10. The semiconductor processing method of claim 1 wherein the pressure during the oxidizing step is less than or equal to 50 atmospheres, and the temperature during the oxidizing step is from 950° C. to 1300° C.

11. The semiconductor processing method of claim 1 wherein the pressure during the oxidizing step is less than or equal to 25 atmospheres, and the temperature during the oxidizing step is from 950° C. to 1300° C.

* * * * *